Figure 1A:
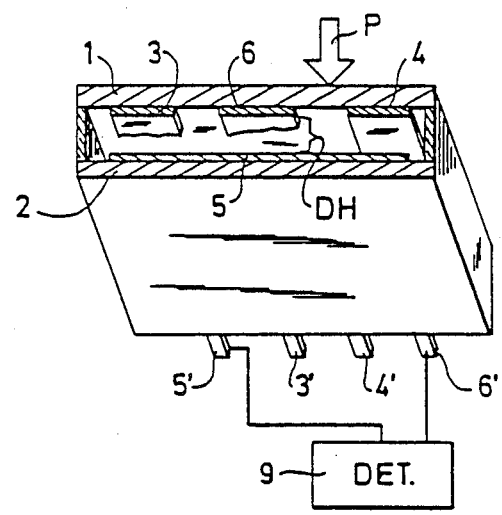

United States Patent [19]

Eriksson

[11] Patent Number: 4,910,504
[45] Date of Patent: Mar. 20, 1990

[54] TOUCH CONTROLLED DISPLAY DEVICE

[75] Inventor: Sören G. Eriksson, Danderyd, Sweden

[73] Assignee: Touch Display Systems AB, Danderyd, Sweden

[21] Appl. No.: 143,202

[22] Filed: Jan. 11, 1988

Related U.S. Application Data

[63] Continuation of Ser. No. 777,779, filed as PCT SE84/00028 on Jan. 30, 1984, published as WO84/03374 on Aug. 1, 1985, abandoned.

[51] Int. Cl.$^4$ .................. G09F 9/35; H03K 17/78
[52] U.S. Cl. .......................... 340/712; 341/23; 341/33
[58] Field of Search ............ 340/365 C, 365 VL, 712, 340/784, 765; 341/33, 23; 200/DIG. 1; 400/479.1

[56] References Cited

U.S. PATENT DOCUMENTS

| 4,224,615 | 9/1980 | Penz | 340/712 |
| 4,290,061 | 9/1981 | Serrano | 340/365 VL |
| 4,529,968 | 7/1985 | Hilsum et al. | 340/712 |
| 4,639,720 | 1/1987 | Rympalski et al. | 340/712 |

FOREIGN PATENT DOCUMENTS

| 2932540 | 2/1981 | Fed. Rep. of Germany. |
| 3039713 | 5/1982 | Fed. Rep. of Germany. |
| 0161521 | 12/1981 | Japan. |
| 2066548 | 7/1981 | United Kingdom. |
| 2094050 | 9/1982 | United Kingdom. |
| 2002522 | 11/1982 | United Kingdom. |

OTHER PUBLICATIONS

Harris and Williams, "Liquid Crystal Display and Touch Panel Keyboard Input", IBM Technical Disclosure Bulletin, vol. 24, No. 4, Sep. 1981.
Xerox Disclosure Journal, vol. 5, No. 5, Sep./Oct. 1980, p. 559.

Primary Examiner—Alvin Oberley
Attorney, Agent, or Firm—Banner, Birch, McKie & Beckett

[57] ABSTRACT

A touch controlled display device has, in one embodiment, two displaying segments disposed on the inside of a front cover window in an LCD unit. Further to causing the segments to display different sign information by providing them with different feeds, they are both utilized as sensing means included in a capacitative sensing circuit which is activable by the finger of an operator.

15 Claims, 2 Drawing Sheets

TOUCH CONTROLLED DISPLAY DEVICE

This application is a continuation of application Ser. No. 777,779, filed as PCT SE84/00028 on Jun. 30, 1984, published as WO85/03374 on Aug. 1, 1985, now abandoned.

TECHNICAL FIELD

The present invention relates to a touch controlled display device including displaying means disposed on the inside of a front cover window of the device.

BACKGROUND ART

Different such display devices are known. By touch control is here primarily intended a control where the operator touches the device with his finger.

Accordingly, there are known such touch controlled display devices where control is exercised by the pressure action to which the device is subjected when the finger touches the device. Examples of pressure controlled display devices are mentioned in the Xerox Disclosure Journal, Vol. 5, No. 5, September/October, 1980, page 559, and in the German Offenlegungsschrift 30 39 713, as well as in the Japanese published specification 56-161521. In the latter there is utilized the capacity change occurring with pressure on the display device, by the distance being altered between detection electrodes and a counter-electrode, these electrodes being disposed on the inside of the respective front and back cover plates of the display device.

These known pressure controlled display devices have troublesome disadvantages, since the cover plates must be elastic in order to be activated by the touch pressure and to return to their initial state after being touched. This elasticity is troublesome, particularly with display devices having a large surface, in which a touch easily results in that the electrodes come into direct contact with each other. Furthermore, repeated pressure loading results in risk of the cover plates becoming fatigued. Operational reliability in such known pressure controlled display devices has been found to be small.

Another type of touch control is carried out with the aid of direct capacitative detection of the finger touch on the display device. In this case, separate touch contacts are placed on the outside of the cover plate or window of the display device. This type may be exemplified by the devices described in the British Patent Applications 2 066 548 and 2 094 050 and the German Offenlegungsschrift 29 32 540.

All the touch control display devices known up to now have required separate detection or touch contacts, thus making the circuitry complicated due to the extra contacts requiring extra wiring. An advantage with disposing the detection contacts on the inside of the transparent window, eg in accordance with the cited Japanese publication, is that the problems of wear and dirtying which trouble all other known devices are dispensed with. However, apart from the mentioned disadvantages there is also a very serious problem with the known devices with separate detection contacts on the inside and outside of the window, namely that these separate contacts, in themselves and due to extra wiring, are extremely voluminous. The separate contacts must namely be disposed at a given distance from each other and from the customary displaying means in the display device. Wiring will be complicated, since the wires from the separate contacts must be accomodated together with other feed and control wires fro the customary displaying means.

DESCRIPTION OF INVENTION

The disadvantage described above are entirely removed by the present invention. Characterizing for the invention is namely that at least one of the displaying means of the display device is adapted to form the capacitative sensing circuit, together with an electrode in the immediate vicinity of, but spaced from the same cover window. With the sensing circuit there is detected the capacitance change $\Delta C$ caused by the mere proximity of such as the operator's finger on the cover window outside. Accordingly, there is no pressure load or deformation of the cover window, and this may thus be inelastic. Neither is there any risk of the display member coming into direct contact with the counter-electrode.

The problem with extra contacts that has so far obstructed miniaturization of activable display devices may be solved by two or more mutually close displaying means being included in the sensing circuit. The inventive subject thus results in extensive simplification of circuit structure, since the ordinary feed circuit wires of the display device may be utilized for the sensing circuit.

The invention may be utilized for different forms of display device, eg those of the liquid crystal type (LCD). A natural application is for different kinds of switching means, from separate switch buttons to entire keyboards. Indications and changes on a display screen built up from LCD's, which have been performed by such as light pens when cathode ray tubes have been used, may now be performed to advantage with the operator's own finger.

The inventive display device may further be self-indicating by it being able to show different statuses with the aid of different implementations of the displaying means, eg by the means being presented in different colours. A further development of the invention in an LCD-type embodiment is also for an LCD drive unit and different types of output to be integrated in a complete switch.

A simple switch formed in accordance with the present invention can replace both an LED and a mechanical switch. This means, inter alia, power savings and a switch that in principle can not be worn out. A very suitable embodiment includes an LCD means implemented as a matrix, possibly with a reversed cursor, the electronics then being able to reproduce different signs, numbers and letters simultaneously as the LCD means can give information to the rear, eg to a microprocessor. Switches of this kind can be stackable in both directions, and be manufactured according to the applicable mechanical standard dimensions. The invention may also be applied to known LCD means.

Manufacture of the display device in accordance with the invention may be carried out in steps, and does not need to mean that a complete module be produced in one step. The following manufacturing steps may thus be applied:

(a) A double segment displaying means is manufactured and disposed in a switch housing.

(b) The product from step (a) is supplemented by an LCD drive unit being built into the housing.

(c) Step (b) is further developed by the displaying means being made with several outputs.

(d) Step (c) is further developed, as is step (d) in its turn etc., for providing different complete modules having functions described above.

PREFERRED EMBODIMENTS

Figure 1B:
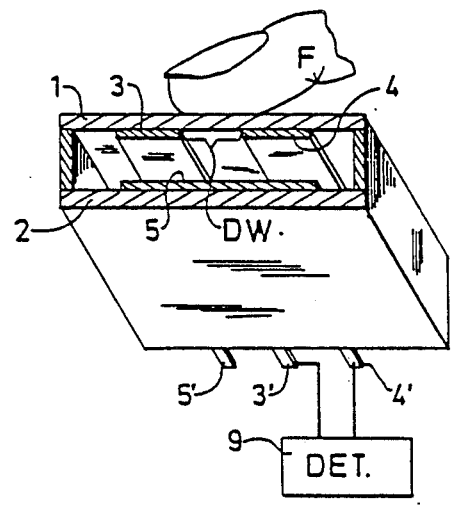
Figure 2:
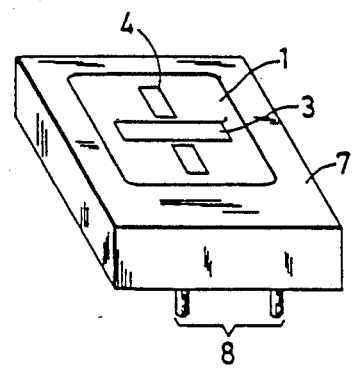
Figure 3:
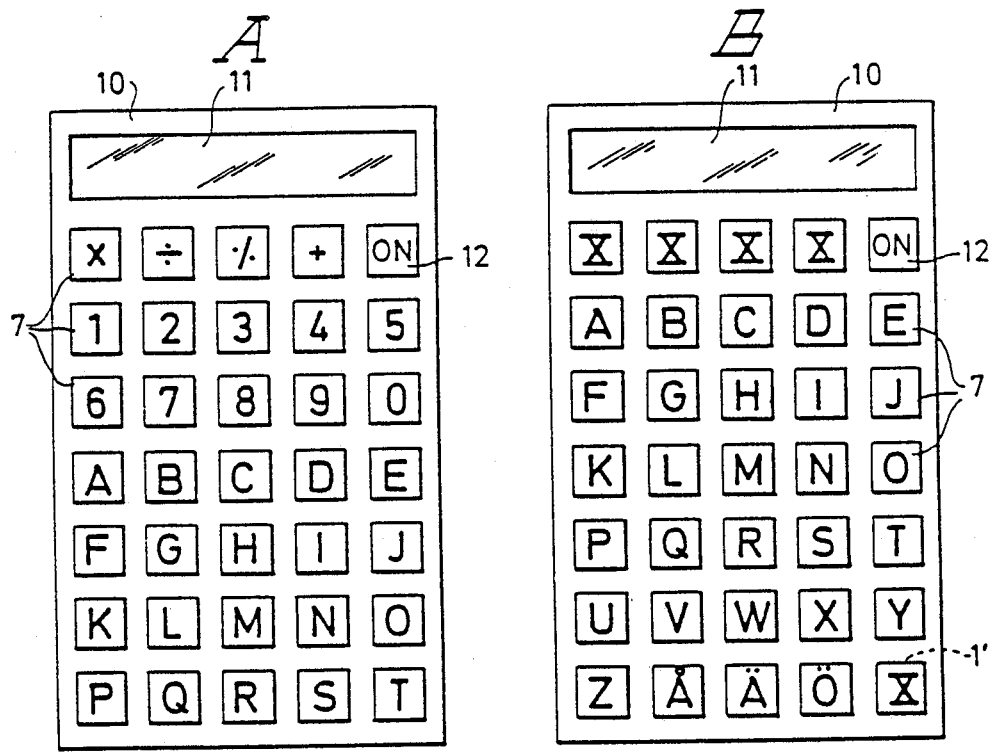
Figure 4:
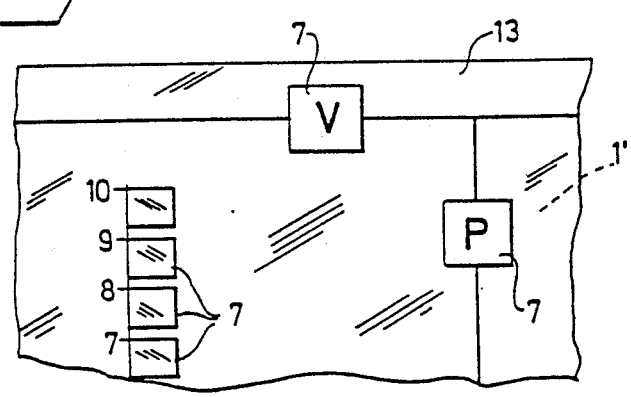

The invention will now be described below in more detail and with reference to the accompanying drawings relating to preferred embodiments, on which:

FIG. 1A illustrates the principle of a known LCD means with a sensing circuit for the detection of change in capacitance, FIG. 1B illustrates the principle of an LCD means in accordance with the present invention, FIG. 2 illustrates a double segment displaying means with an integrated circuit executed in accordance with the invention, FIG. 3 illustrates a keyboard with display devices in accordance with the invention, and FIG. 4 is a section of a control panel with graphical symbols formed according to the present invention.

FIG. 1A illustrates the principle of a known touch controlled display device, eg of the type described in the Japanese published specification 56-161521. The device is formed as an LCD unit with a front window 1 and back cover window 2. On the inside of the front window 1 there are thin displaying means 3,4 which, together with a common counter-electrode 5 disposed on the inside of the back window 2 are intended to energise the liquid crystals (not shown) accomodated between the windows 1,2 in response to the voltage feed by the means 3,4 and the counter-electrode 5. This feed takes place via the pins 3', 4' and 5' respectively to each of the means 3 and 4 as well as the counter-electrode 5.

The known touch controlled LCD unit of FIG. 1A has a detection electrode 6, having a distance DH to the counter-electrode 5 for an unenergised LCD unit. The detection electrode is connected to a pin 6' intended for connection to a detection circuit 9, which is also connected to the pin 5'. To energise the touch controlled LCD unit, an exterior force P must be applied, eg by an operator pressing a finger on the front window 1 of the LCD unit. There thus occurs a change in distance of ΔDH, due to the elasticity of the window, the change ΔDH in turn giving rise to the capacitance C between the detection electrode 6 and electrode 5 being changed to a new value C' as long as the force P remains. The capacitance values C and C' are sensed by the detection circuit 9 connected to the pins 5' and 6'.

As explained above, the known touch controlled display device is burdened with a series of problems making it unsuitable for use in different "utility articles". These problems are avoided with a touch controlled display device in accordance with the invention, the principle of which is illustrated in FIG. 1B. The device illustrated in this Figure has, as with the known device of FIG. 1A, front and back cover windows 1 and 2. On its inside the front window 1 carries two display means 3, 4 while the back window carries the counter-electrode 5 on its inside. The device in accordance with the invention is driven in the same way as the known device by voltage feed via pins 3', 4' and 5' associated with the means 3, 4 and electrode 5.

In contradistinction to the principle for touch controlled display devices illustrated in FIG. 1A, the inventive device does not need to have elastically deformable cover windows, and these are to advantage undeformable.

Furthermore, there are no extra, separate electrodes and neither is there any extra wiring or connection pin for the detection circuit 9. The normal displaying means 3, 4 are utilised for detection, their mutual spacing DW corresponding to a given capacitance value. On touch, eg by the operator placing a finger F on the front window 1, this capacitance value is changed by ΔC. This change ΔC can be sensed by the detection circuit 9, which is connected to the pins 3', 4' similarly intended for driving the display device.

The capacitance change ΔC sensed by the sensing circuit 9 causes an electrical signal which may be fed from the circuit 9 to control apparatus of different kinds such as switches, microprocessors and the like. It should be noted that only one of the displaying means, eg that denoted by the numeral 3, needs to be connected to the drive circuit, while the other (eg 4) is more or less to be regarded as a counter-electrode, which is accordingly never intended to illuminate.

In FIG. 2 there is depicted a display device 7 implemented such as to be stackable in accordance with the invention, and taking the form of an LCD unit with two displaying means 3, 4. The device 7 is fed with voltage via connection pins 8, and includes an unillustrated integrated circuit. By touching the window 1, both displaying means 3, 4 (segments) on the front cover window 1 can be caused to be switched for displaying a plus or a minus sign.

The display device 7, in the form of stackable blocks according to FIG. 2 can be built together, eg to form a keyboard 10, as illustrated in FIG. 3. The keyboard 10 is thus made up from matrices that can form different sign blocks 7 and have a text window 11. The text window may have a plurality of sign displayers displaying the sign keyed-in with the aid of the respective block. Each block 7 may represent different signs, as will be apparent from FIGS. 3A and 3B. By touching block 12 "on", the remaining blocks 7 of the keyboard 10 can change sign character and function. For example, a block 7 showing a "1" in FIG. 3A (resulting in that on touch there is displayed a "1" in the window 11) can be switched to display an "A" after the block 12 has been touched, according to FIG. 3B. After such switching, this block functions as a key for keying in an "A" in the text window 11. Renewed touching of block 12 returns block 7 to the sign character and function illustrated in FIG. 3A.

The keyboard 10 illustrated in FIG. 3 does not necessarily need to be made up from individual blocks 7, but can be formed as a single LCD unit. Accordingly, all "blocks 7, 12" and the different sign displayers of the text window 11 directly formed on the front cover window 1', as indicated by dashed lines in FIG. 3. It will thus be understood that the dimensions of the keyboard 10 can be minimal. However there is nothing to stop the cover window 1' from being made large, since the key functions are not tied up with any elasticity or change in distance for the detection of ΔC, as is the case for touch controlled display devices in the prior art.

The control signals generated in the respective block-/key 7, which are fed to the text window 11 in the illustrated embodiment, may of course be utilised for treatment in a microprocessor or other form of data processor, or be stored in a memory.

A further application for the inventive touch controlled display device is illustrated in FIG. 4, namely as a switchboard in an industry such as a paper mill. As with the keyboard 10 of FIG. 3, the switchboard 13 may be formed with a single cover window 1' in an LCD unit. Alternatively the display 13 may include stackable blocks 7, each of which has a different display character and switch function. FIG. 4 merely illustrates a portion of a panel where the blocks 7 may be "illuminated" or "extinguished" or signal different operational functions for the machines the respective block is intended to affect. For example, block "V" could relate to an openable and closable valve, block "p" to a connectable or disconnectable pump and the remaining blocks 7 to the regulation of the level of liquid in a tank.

As will be apparent from the exemplifications mentioned above, the fields of application are infinite for the touch controlled display device in accordance with the invention, due to the possibilities of variation in signs and symbols. The examples above refer to display devices with two displaying means 3, 4 (segments), but the invention is of course applicable to display devices with on or more segments, eg to ordinary number indicators with seven segments or sign matrices. Neither is the invention limited to LCD units, but is applicable to all display devices where individual displaying means are driven from one drive circuit. The present invention may therefore not be considered as limited to the embodiments described above and illustrated on the appended drawings.

I claim:

1. In a touch controlled display device having first and second display electrodes disposed on the inside of a front cover window of said device capable of displaying information and a counter-electrode within said device, wherein said first and second electrodes and said counter-electrode cooperate to form a display means, and wherein said counter-electrode activates the display of said information, the improvement comprising said first and second electrodes being adapted for inclusion in a capacitive sensing circuit, wherein the capacitance between said first and second electrodes is measured by said capacitive sensing circuit.

2. The display device of claim 1 wherein said display is an LCD display having at least one LCD segment being included in said capacitive sensing circuit.

3. The display device of claim 2 wherein said display is adapted as a touch-activated switch, which is self-indicating by the segments being disposed for displaying different information.

4. The display device of claim 3 wherein said switch includes an LCD drive unit integrated therewith, said LCD drive unit also being included in said sensing circuit and being formed with a plurality of types of outputs.

5. The display device of claim 3 wherein said switch is formed as a sign-displaying matrix and said sensing circuit is connectable to a microprocessor.

6. The display device of claim 3 wherein a plurality of said switches are provided to form a keyboard means.

7. A touch controlled display device, said device comprising:

at least one first electrode capable of displaying information;

at least one second electrode capable of displaying information and positioned adjacent said first electrode and having a predetermined electrical capacitance therebetween, said capacitance changing when said first and second electrodes come in close proximity to the user, wherein the change in said capacitance is measured;

a counter-electrode which cooperates with said first electrode and said second electrode to form a display means, wherein said counter-electrode activates the display of said information;

display control means coupled to said first and second electrodes for controlling the display operation of said first and second electrodes; and detector means coupled to said first and second electrodes for detecting said electrical capacitance, wherein in response to said first and second electrodes coming in close proximity to the user, said detector means provides a first signal when said capacitance is below a predetermined level and a second signal when said capacitance is above a predetermined level.

8. The touch controlled display device of claim 7 wherein said display control means is coupled to said detector means and controls said first and second electrodes to display information corresponding to whether said first and second electrodes have been touched.

9. The touch controlled display device of claim 7 further including a display window, said first and second electrodes being mounted to a surface of said window and the information displayed by said first and second electrodes being visible through said window.

10. The touch controlled display device of claim 9 wherein in response to the surface of said window being touched, said capacitance between said first and second electrodes changes and said change is detected by said detector means.

11. The touch controlled display device of claim 7 wherein said first and second electrodes form an LCD display.

12. The touch controlled display device of claim 7 further including a plurality of first and second electrodes arranged such that certain ones of said electrodes display information different from others of said electrodes.

13. The touch controlled display device of claim 12 wherein said plurality of first and second electrodes are coupled to said control means and are controlled by said control means.

14. The touch controlled display device of claim 13 wherein said certain ones of said electrodes display said information in response to coming into close proximity with the user.

15. The touch controlled display device of claim 13 wherein said plurality of first and second electrodes, said control means and said detector means are arranged to provide a plurality display elements and corresponding switch elements, the electrodes which form a particular display element also being used to form the corresponding switch element.

* * * * *